US009696397B2

(12) United States Patent
Rozenfeld et al.

(10) Patent No.: US 9,696,397 B2
(45) Date of Patent: Jul. 4, 2017

(54) MAGNETIC RESONANCE APPARATUS FOR FAST AND RELIABLE DETECTION AND RECOGNITION OF MINUTE QUANTITIES OF SPECIFIC SUBSTANCES

(71) Applicant: Micro-Tag Temed Ltd., Arava (IL)

(72) Inventors: Yuri Rozenfeld, Yeruham (IL);
Alexander Shames, Beer-Sheva (IL);
Dmitri Fialkov, Beer-Sheva (IL);
Alexander Ovchinikov, Petah-Tikva (IL); Igor Gontcharenko, Bonn (DE);
David Keini, Haifa (IL)

(73) Assignee: MICRO-TAG TEMED LTD., Arava (IL)

( * ) Notice: Subject to any disclaimer, the term of this patent is extended or adjusted under 35 U.S.C. 154(b) by 641 days.

(21) Appl. No.: 14/206,575

(22) Filed: Mar. 12, 2014

(65) Prior Publication Data

US 2014/0266202 A1 Sep. 18, 2014

(30) Foreign Application Priority Data

Mar. 14, 2013 (IL) .......................................... 225219

(51) Int. Cl.
*G01R 33/44* (2006.01)
*G01R 33/46* (2006.01)

(52) U.S. Cl.
CPC ......... *G01R 33/4625* (2013.01); *G01R 33/44* (2013.01); *G01R 33/441* (2013.01)

(58) Field of Classification Search
CPC ... G01R 33/4625; G01R 33/44; G01R 33/441
See application file for complete search history.

(56) References Cited

U.S. PATENT DOCUMENTS 4,376,264 A 3/1983 Dokter et al.
4,451,521 A 5/1984 Kaule et al.
(Continued)

FOREIGN PATENT DOCUMENTS

CH 662194 9/1987
DE 10118679 10/2002
(Continued)

OTHER PUBLICATIONS

Gergorovic, A., et al. 2009. "TNT detection with 14N NQR: Multipulse sequence and matched filter", Journal of Magnetic Resonance, 198(2): 215-221. XP026101442.
(Continued)

*Primary Examiner* — G. M. Hyder
(74) *Attorney, Agent, or Firm* — Cantor Colburn LLP

(57) ABSTRACT

Detection and recognition of taggant substances having predefined zero external field magnetic resonance signatures. An object comprising taggant substance(s) is irradiated with a sequence of specific excitation pulses of electromagnetic radiation within a predetermined time and frequency scanning pattern, responsive nuclear spin echo signals are received from the object with a predetermined time and frequency acquisition pattern and data indicative thereof is generated. The scanning and acquisition patterns used permit successive transmission of pulses of multiple frequencies using a two-pulse spin-echo excitation technique, or a steady state-spin echo excitation technique, and successive acquisition of multiple nuclear spin echo response signals, within a time slot between two successive excitation pulses of a specific excitation frequency. The generated data is correlated with reference data corresponding to predetermined taggant substance(s) and one or more taggant substances are identified based on the determined correlation.

22 Claims, 6 Drawing Sheets

(56) References Cited

U.S. PATENT DOCUMENTS

| | | | |
|---|---|---|---|
| 5,149,946 A | 9/1992 | Jerome et al. | |
| 5,175,499 A | 12/1992 | Davies | |
| 5,814,989 A | 9/1998 | Smith et al. | |
| 5,986,550 A | 11/1999 | Rapaport et al. | |
| 6,344,261 B1 | 2/2002 | Kaule et al. | |
| 6,383,618 B1 | 5/2002 | Kaule et al. | |
| 7,345,478 B2 * | 3/2008 | Lieblich | G01R 33/441 324/300 |
| 2007/0075865 A1 | 4/2007 | Spencer et al. | |
| 2008/0076536 A1 | 3/2008 | Shayesteh | |

FOREIGN PATENT DOCUMENTS

| | | |
|---|---|---|
| NL | 6613250 | 3/1967 |
| WO | 02084608 A2 | 10/2002 |

OTHER PUBLICATIONS

Liou, Y. C. & Chen, Y. R. 2008. "Synthesis and microstructure of (LaSr)MnO3 and (LaSr)FeO3 ceramics by a reaction-sintering process", Ceramics International, 34: 273-278.

Yasuka, H., et al. 1967. "NMR Determination of Metal Ion Distribution in Manganese Ferrite Prepared from Aqueous Solutions:", Journal of the Physical Society of Japan, 22(1): 174-180.

Textbook in Chinese, 1999, p. 214.

Textbook in Chinese, 2011, p. 296.

\* cited by examiner

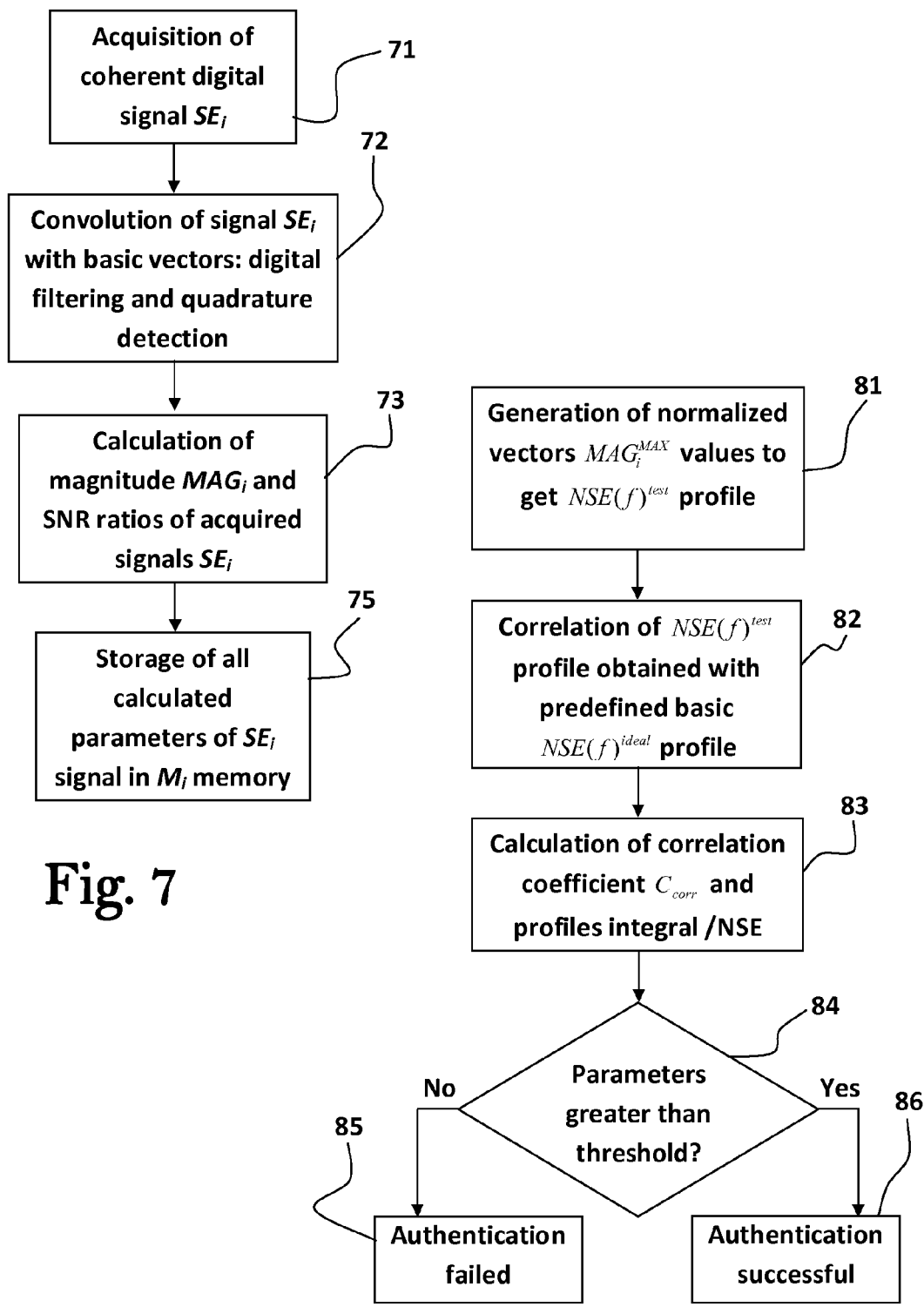

MAGNETIC RESONANCE APPARATUS FOR FAST AND RELIABLE DETECTION AND RECOGNITION OF MINUTE QUANTITIES OF SPECIFIC SUBSTANCES

TECHNOLOGICAL FIELD

The invention relates to the detection and recognition of minute quantities of substances having predefined zero external field magnetic resonance signatures.

BACKGROUND

Numerous techniques have been proposed for authenticating valuable documents (e.g., banknotes), objects (e.g., jewelry, paintings), and suchlike. For example, NL 6,613,250 suggests using a chemical test for recognizing printed documents as genuine, and U.S. Pat. Nos. 4,451,521, 6,344,261 and 6,383,618 suggest various luminescent techniques for the authentication of valuable/security documents.

A magnetic resonance technique (electron paramagnetic resonance—EPR, also known as electron spin resonance—ESR) for authenticating or identifying papers of value is described in U.S. Pat. No. 4,376,264, which suggests using substances having EPR characteristics detected by high field EPR in microwave band (starting from 1 GHz). In another method described in U.S. Pat. No. 5,149,946, radio-frequency band ESR authentication technique is proposed.

U.S. Pat. No. 5,175,499 describes techniques for authenticating a resonant material using microwave or radio frequency source to emit excitation electromagnetic radiation. Some more recent patent literature publications, such as CH 662194, WO 02/084608, and DE 10118679, propose use of EPR (electron paramagnetic resonance) and FMR (ferromagnetic resonance) for the purpose of identification and authentication of papers of value and other objects.

The aforementioned techniques are based on a variety of magnetic resonance phenomena. These phenomena are associated with nuclear, electron, atomic or molecular magnetic dipole moments acting individually or cooperatively in the presence of external magnetic fields to yield nuclear magnetic resonance (NMR), electron spin/paramagnetic resonance (ESR/EPR), ferromagnetic resonance (FMR), and suchlike.

Magnetic resonance phenomena are exhibited when magnetic dipole moments processing in a magnetic field absorb and re-radiate microwave or radio-frequency electromagnetic radiation at, or very close to, the precession frequency. A main disadvantage in utilizing the magnetic resonance phenomena for the purposes of authenticating and/or identifying objects is the necessity of an external static magnetic field for the excitation and detection of a resonance response. This external static magnetic field is usually applied either by a large electro- or superconducting magnet over the entire interrogation volume, or by a small permanent or semi-permanent magnet element placed close to the interrogated resonant material. For obtaining resonance responses with high sensitivity and high resolution, the applied external static magnetic field should be rather strong (of about, or greater than, 10 milliTesla) and be a homogeneous field. These requirements complicate both the arrangement of the marker/label, and the design of the probing device used to interrogate the resonant material carried by the marker/label. Further, the presence of a strong external magnetic field within the interrogation volume, or near the marker, may present health hazards (e.g., interference with operation of live supporting equipment such as pacemakers and suchlike), as well as the risk of wiping out data contained on magnetic media. These deficiencies render the task of identifying credit/bank cards, or other information carriers sensitive to external magnetic fields, extremely difficult.

U.S. Pat. No. 5,986,550, assigned to the same assignee as the present application and is hereby incorporated by reference, suggests marking/labeling objects for identification and authentication of the objects using techniques based on mixed electron-nuclear resonances. In this technique the precession of nuclear electric or magnetic dipole moments is provoked by cooperative or individual electronic subsystems.

GENERAL DESCRIPTION

Nuclear magnetic resonance (NMR) readers are typically bulky stationary devices requiring considerably long time durations (e.g., from several minutes to a few hours) to provide measurement results. The inventors of the present invention have developed a novel compact handheld nuclear magnetic resonance apparatus configured to carry out fast and reliable detection and recognition of minute quantities of substances having predefined zero external field magnetic resonance signatures (also referred to herein as taggant substances). The inventors of the present invention have designed a handheld magnetic resonance reader capable of operating in noisy environments characterized by signal-to-noise ratio conditions smaller than one, and capable of reliably determining presence or absence of taggant substances in examined objects/specimens. The magnetic resonance apparatus disclosed herein is thus particularly useful for authenticating objects/specimens marked by minute quantities of taggant substances.

A principal feature of the apparatus disclosed herein is identification of presence or absence of minute quantities of substances having predefined zero external field magnetic resonance signatures, and does not require applying an external magnetic field over the examined object/specimen. Therefore, current driven coils of electromagnet and/or permanent magnets are not used in the NMR reader disclosed herein, which facilitates compactness of the apparatus design. In some embodiments, the signal acquisition path of the reader is designed to carry out single channel acquisition, employing down conversion of the received signals to an intermediate frequency, and digital quadrature signal processing, thereby substantially simplifying the hardware and the design considerations of the apparatus, and enabling to implement a magnetic resonance apparatus having relatively small geometrical dimensions (e.g., a hand-held device having dimensions of a modern mobile or smart phone).

In preferred embodiments, the apparatus is designed to improve the signal-to-noise ratio of the measurements employing a specially designed signal excitation/acquisition scheme allowing the apparatus to consecutively apply a plurality of excitation pulses associated with different resonance frequencies and acquire responsive spin echo signals within time slots extending between successively applied excitation pulses of a specific excitation frequency. The spin echo signals acquired within each time slot are associated with the excitation pulses between which the time slot is defined, and optionally also with differing frequencies. The duration and timing of the time slots are determined according to spin-lattice relaxation time of nuclei resonating at the specific frequency of the excitation pulses between which the time slot is defined.

This excitation/acquisition scheme allows consecutive excitation of nuclei of various different substances associated with different resonance frequencies, and consecutive acquisition, interlaced with the excitation sequence, of spin echo signals associated with one or more resonance frequencies, without requiring to wait the full relaxation time of each type of nucleus (i.e., 1.3 $T_{1i}$), as typically performed after applying an excitation sequence associated with a specific resonant frequency.

More particularly, it is common in NMR spectroscopy applications to apply excitation signals associated with a specific resonance frequency ($f_{SEi}$) and then wait for at least 1.3 $T_{1i}$ seconds to acquire responsively emitted spin echo signals, in order to guarantee full or partial relaxation of the initial magnetization due to respective nuclei. However, the 1.3 $T_{1i}$ relaxation time is relatively long even for solid materials (e.g., between 100 microseconds to tens of seconds), and thus the total time required to excite and acquire spin echo signals for several different materials using such conventional NMR techniques is typically long (tens of minutes). The excitation/acquisition scheme of the present invention thus allows acquiring spin echo signals for a plurality of excitation frequencies within relatively short durations of time, since the excitation/acquisition process is not halted for 1.3 $T_{1i}$ seconds after each excitation of specific frequency $f_{SEi}$.

The excitation/acquisition technique of the present invention thus enables to acquire a significant amount of practically independent spin echo signals (e.g., from three, for the simplest magnetic resonance signature, to tens, when dealing with complicated magnetic resonance signatures), within relatively short time durations (e.g., a few seconds). The ability to acquire such a great number of spin echo signals results in obtaining a complicated magnetic resonance signature with enhanced signal-to-noise ratio, thereby allowing detection of minute quantities of substances in relatively noisy environments with signal-to-noise ratio smaller than one (i.e., by collecting large amounts of spin echo data within a relatively short time).

An additional feature of the apparatus disclosed herein is its ability to be easily modified by software programming. In particular, the apparatus, in some embodiments, can be easily modified to permit different modes of operation, and to use different parameters for identifying a plurality of totally different marking/labeling materials having a wide range of physical-chemical properties and magnetic resonance signatures.

In one aspect there is provided a compact low cost hand-held magnetic resonance apparatus for performing fast and reliable detection and recognition of minute quantities of substances having predefined zero external field magnetic resonance signatures. For example, the materials may be applied to objects, and they are thus usable for marking/labeling, authenticating and identifying the marked objects. The present invention further provides in some embodiments thereof methods of wide line magnetic resonance signal excitation and acquisition, methods for the processing of weak magnetic resonance signals and for recognition of magnetic resonance signatures, while providing high reliable identification in conditions characterized by signal-to-noise ratios below 1.

The following terms should be given the following meanings:

The term "zero external static field radio-frequency resonance" is used herein to refer to the magnetic and spin phenomena attributed to this term in U.S. Pat. No. 5,986,550, the disclosure of which is incorporated herein by reference.

The term "zero external field" is associated with the aforementioned phenomena and implies that such resonances can be observed in the absence of any external static field, or at very weak external static fields such as the Earth's magnetic field (0.025 to 0.065 milliTesla). It is however important to note that such a weak external magnetic field is not necessary for the resonance effect, but also does not prevent such an effect.

The term "radio-frequencies" (RF) is used herein to refer to electromagnetic frequencies in the range of 1 MHz to 1 GHz.

The term "spin echo signal" is used herein to relate to magnetic resonance signals generated by applying at least two consecutive RF excitation pulses at resonant frequency to substances containing structural units (e.g., nuclei, conducting electrons, transition metal and rare earth ions, free radicals, and suchlike) with non-zero spins.

The term "room temperature" is used herein to refer to the temperature range of common working conditions, both below and above 0° C., which does not require special cooling to cryogenic temperatures or heating to high temperatures.

The term "fingerprint taggant" is used herein to refer to substances exhibiting zero external field resonance phenomena usable for object marking/labeling, authenticating and/or identifying.

The term "signature" is used herein to refer to a set of parameters characterizing the "fingerprint taggant".

The term "reader" is used herein to refer to a magnetic resonance apparatus usable for performing fast and reliable detection and recognition of minute quantities of fingerprint taggants.

As used in the specification and claims, the singular forms "a", "an" and "the" include plural references unless the context clearly dictates otherwise. For example, the term "a taggant" may include a plurality of taggants unless the context clearly dictates otherwise.

In one aspect there is thus provided an apparatus for detection and recognition of taggant substances of a type having predefined zero external field magnetic resonance signatures. The apparatus may be configured as a hand-held device comprising: a signal generator configured and operable for generating a sequence of specific excitation pulses of electromagnetic radiation within a predefined frequency band (e.g., in the range of 10 to 1000 MHz); a probehead comprising a transmitter connected to the signal generator and configured and operable to receive the sequence of specific excitation pulses of electromagnetic radiation, and to irradiate an object comprising one or more of the taggant substances with the pulsed electromagnetic radiation, and a receiver (e.g., a single channel wide band receiver) configured and operable for acquiring nuclear spin echo response signals from the irradiated object and generating data indicative thereof; and a control system for operating units of the apparatus, processing the generated data and identifying the one or more taggant substances.

In some embodiments the control system comprises a transmission controller configured and operable to operate the signal generator to generate the sequence of specific excitation pulses having a predetermined time and frequency scanning pattern, an acquisition controller configured and operable to operate the receiver for acquiring the nuclear spin echo response signals with a predetermined time and frequency acquisition pattern, and an analyzer utility for receiving data indicative of the nuclear spin echo response signals, for correlating the data with reference data corresponding to one or more predetermined taggant substances, and based on determined correlation, identifying the one or more taggant substances.

In some embodiments the pulses of multiple frequencies are successively transmitted using a two-pulse spin-echo excitation technique or a steady state-spin echo excitation technique, and multiple nuclear spin echo response signals are successively acquired within a time slot between two successive excitation pulses of a specific excitation frequency. Preferably, the successively acquired responses are associated with the specific frequency and with other resonance frequencies, and the time slot is selected in accordance with spin-lattice relaxation time of nuclei resonating at the specific frequency.

The taggant substances may comprise one or more substances selected from the group consisting of: ferromagnetic substances, ferrimagnetic substances, antiferromagnetic substances, and substances containing nuclei with non-zero nuclear quadrupole moments.

The analyzer utility may be configured and operable in some embodiments to decompose the data indicative of the nuclear spin echo response signals into in-phase and quadrature components and generate data indicative of the magnitude of the components for use in correlating with the reference data. The analyzer may be configured and operable to identify the one or more taggant substances based on one or more of the following parameters: a correlation coefficient calculated based on the correlation with the reference data, a profile integral value calculated based on the data indicative of the magnitude of the in-phase and quadrature components, calculated signal-to-noise-ratio of the received signals, and calculated signal-to-noise-ratio of the noise of the received signals.

The signal generator comprises in some embodiments a frequency synthesizer configured and operable to generate continuous time periodic signals in the band of excitation frequencies. The apparatus may further comprise an RF pulse modulator configured and operable to generate the sequence of specific excitation pulses of electromagnetic radiation using the periodic signals generated by the frequency synthesizer.

The apparatus may further comprise a demodulator unit configured and operable to extract the nuclear spin echo response signals from the acquired responsive signals, and a narrow band amplifier configured to operate at a predefined intermediate frequency determined by the signal generator and the demodulator unit.

A near field antenna (e.g., comprising a flat meander-line coil) may be used in the probehead, as well as controllable tuning circuitry configured and operable to adjust reactance of the antenna to frequencies of the signals received or transmitted by the antenna. The controllable tuning circuitry may comprise voltage-controlled matching and tuning capacitors. The controllable tuning circuitry may be usable to adjust the probehead to operate at each of the frequencies within the band of 10-1000 MHz. A controllable switching circuitry may be used in the probehead to selectively communicate signals from the signal generator to the antenna, and to communicate the received response signals from the antenna to one of the processor and the demodulator. The probehead may further comprise one or more amplifiers configured and operable to amplify the signals received from the signals generator and the responsive signals received by the antenna.

In some embodiments the apparatus comprises a security unit configured and operable to protect the apparatus against unauthorized copying and tampering. The security unit may be usable for generating digital signatures for stored or transferred data. The security unit may be usable to exchange security keys with the control system.

According to another aspect, there is provided a method for detection and recognition of taggant substances of a type having predefined zero external field magnetic resonance signatures, the method comprising irradiating an object comprising one or more of the taggant substances with a sequence of specific excitation pulses of electromagnetic radiation within a predefined frequency band and having a predetermined time and frequency scanning pattern, receiving nuclear spin echo response signals with a predetermined time and frequency acquisition pattern from the irradiated object, and generating data indicative thereof, and correlating the data indicative of the nuclear spin echo response signals with reference data corresponding to one or more predetermined taggant substances, and based on determined correlation, identifying said one or more taggant substances, the scanning and acquisition patterns are such that the pulses of multiple frequencies are successively transmitted using a two-pulse spin-echo excitation technique or a steady state-spin echo excitation technique, and multiple nuclear spin echo response signals are successively acquired within a time slot between two successive excitation pulses of a specific excitation frequency.

In some embodiments the successively acquired responses are associated with the specific frequency and with other resonance frequencies, and the time slot being selected in accordance with spin-lattice relaxation time of nuclei resonating at the specific frequency.

The irradiating may comprise scanning the frequency band a plurality of $N_{acq}$ times to acquire respective $N_{acq}$ nuclear spin echo response signals for each excitation frequency and repeatedly applying each excitation pulse associated with a specific excitation frequency within each scan a plurality of $M_{SEi}$ times to acquire a total of $M_{SEi} \times N_{Acq}$ accumulated steady state spin echoes for each excitation frequency (e.g., using the steady state-spin echo excitation technique). The accumulated steady state spin echoes of each excitation frequency may be used to improve the signal to noise ratio by a factor of $\sim 0.7 \times \sqrt{M_{SEi} \times N_{Acq}}$.

The method may further comprise transforming the nuclear spin echo response signals into in-phase and quadrature components and generating data indicative of the magnitude of said components for use in correlating with the reference data.

BRIEF DESCRIPTION OF THE DRAWINGS

In order to understand the invention and to see how it may be carried out in practice, embodiments will now be described, by way of non-limiting example only, with reference to the accompanying figures, in which the corresponding numerals in the different figures refer to corresponding parts, and in which:

FIGS. 1A and 1B schematically illustrate a reader according to some possible embodiments, wherein FIG. 1A illustrates a possible design and operation of the reader and FIG. 1B is a block diagram exemplifying general structure of the reader;

FIG. 7 is a flowchart exemplifying single spin echo signal processing according to some possible embodiments;

FIG. 8 is a flowchart exemplifying multiple spin echo signals analysis and recognition of zero external field magnetic resonance signature according to some possible embodiments;

DETAILED DESCRIPTION OF EMBODIMENTS

Figure 1A:
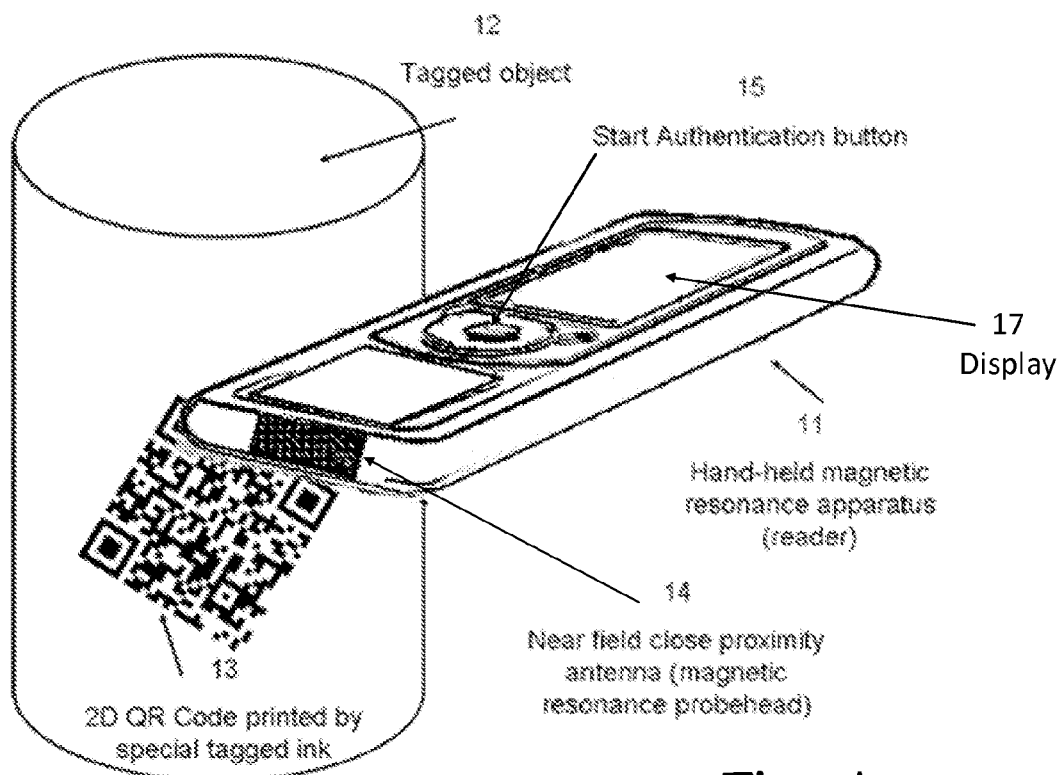

The various embodiments of the present invention are described below with reference to FIGS. 1 through 10 of the drawings, which are to be considered in all aspects as illustrative only and not restrictive in any manner. Elements illustrated in the drawings are not necessarily to scale, emphasis instead being placed upon clearly illustrating the principles of the invention. This invention may be provided in other specific forms and embodiments without departing from the essential characteristics described herein.

FIG. 1A shows a perspective view of one possible embodiment of a reader 11 for exciting and detecting of authenticating magnetic resonance signals emitted from an object 12 carrying a label (e.g., 2D or coded) 13 marked/labeled by a specific fingerprint taggant. In this embodiment the taggant was embedded into the black ink used for printing the label 13. It is however noted that the taggant may be embedded into, or manufactured as, any suitable printable material having any suitable color, or even being transparent to the naked eye.

For authenticating the object 12 the near field antenna (probehead) 14 of the reader 11 is placed in close proximity (e.g., about 0 to 10 mm) with the label 13, and an activation push button 15 of the reader 11 is pressed to apply RF excitation signals over the fingerprint taggant. In response to the applied RF excitation signals the reader 11 receives and analyses magnetic resonance signals (e.g., spin echo signals) emitted from the taggant, and determines the authenticity of the examined label 13. The reader 11 then reports (e.g., using flashing light emitting diodes—LEDs, text/icons in alpha-numerical or graphical display 17 and/or audible signals) on results of the authentication process. It is noted that other configurations and designs of the reader 11 are of course possible, without departing from the scope and spirit of the present invention.

Figure 1B:
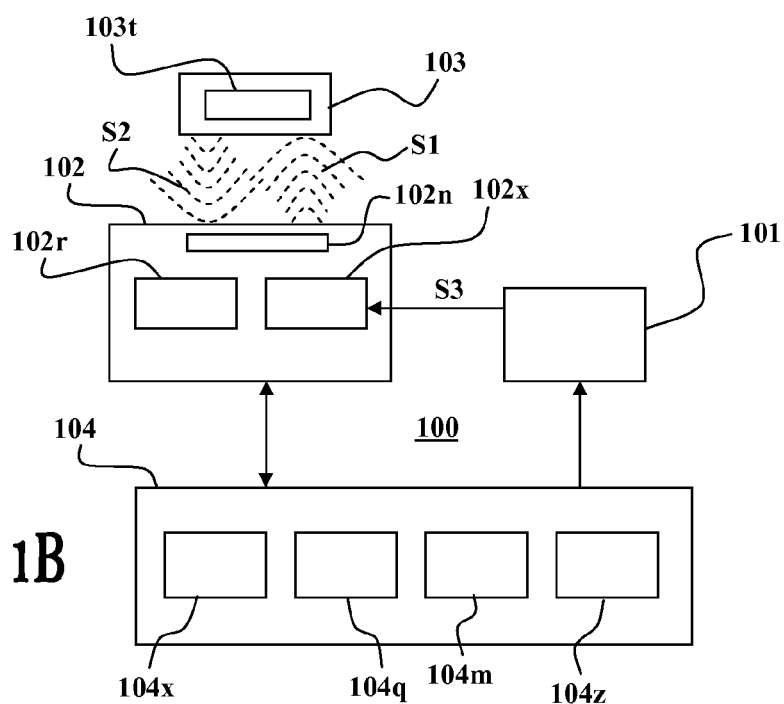

FIG. 1B shows a possible implementation of reader 100 according to some embodiments. The reader 100 is configured and operable to detect and identify taggants 103t used for marking an object 103 to be authenticated (also referred to herein as examined object) by the reader 100. The taggants 103t may comprise one or more substances of a type having predefined zero external field magnetic resonance signatures. The reader 100 in this example is configured as a hand-held device comprising a signal generator 101 configured and operable to generate a sequence of specific RF excitation pulses S3 of electromagnetic radiation within a predefined frequency band (e.g., in the range of 10 to 1000 MHz), a probehead 102 configured and operable to apply excitation signals S1 towards the examined object 103 and receive responsive signals S2 emitted from the examined object 103, and a control system 104 configured and operable to operate units of the reader 100, process and analyze the received signals S2, and determine presence, or absence, of one or more taggant substances in the examined object 103.

In some embodiments the probehead 102 comprises a transmitter 102x, connected to the signal generator 101 and configured and operable to receive the sequence of specific excitation pulses of electromagnetic radiation S3, and to transmit the pulsed electromagnetic radiation S1 to excite one or more of the taggant substances 103t used for marking the object 103. The probehead 102 further comprises a receiver 102r configured and operable to acquire the response signals S2 from the irradiated object 103 and generate data indicative thereof. The probehead 102 further includes one or more antennas 102n configured and operable to selectively connect to the transmitter 102x or to the receiver 102r, to respectively irradiate the RF excitation pulses S1 or to receive the responsive signals S2 emitted from the object 103.

In some embodiments the control system 104 comprises a transmission controller 104x configured and operable to operate the signal generator 101 to generate the sequence of specific excitation pulses S3 having a predetermined time and frequency scanning pattern. The transmission controller 104x may be further adapted to control the operation of the transmitter 102x, and to adjust the probehead 102 for proper transmission of the RF excitation pulses at the different excitation frequencies associated with each of the RF excitation pulses. The control system 104 may further comprise an acquisition controller 104q configured and operable to operate the receiver 102r for acquiring the response signals S2 with a predetermined time and frequency acquisition pattern. The acquisition controller 104q may be further adapted to adjust the probehead 102 to receive the signals S2 associated with specific excitation frequencies.

In possible embodiments the scanning and acquisition patterns are such that the RF excitation pulses S1 of multiple frequencies are successively transmitted, and multiple nuclear response signals S2 are successively acquired within a time slot between two successive excitation pulses associated with a specific excitation frequency. Each time slot is selected in accordance with spin-lattice relaxation time of nuclei resonating at the specific frequency associated with the two successive excitation pulses associated with the specific excitation frequency between which the time slot is defined, and the spin echo signals acquired during the time slot are associated with resonance frequencies that are different from the specific frequency.

More particularly, in some embodiments, the transmission controller 104x is configured and operable to schedule generation of multiple sequences of RF excitation pulses S3 of different excitation frequencies by the signal generator 101, and to operate the transmitter 102x to transmit the multiple RF excitation sequences received from the signal generator 101. The multiple RF excitation sequences S3 may be configured to include appropriate time gaps (also referred to herein as time slots) between successive RF excitation pulses associated with the same specific excitation frequency, to permit acquisition of the response signals S2 associated said specific frequency and with other excitation frequencies emitted from the object 103 responsive to previously transmitted RF excitation sequences.

Accordingly, the acquisition controller 104q is configured and operable to schedule operation of the receiver 102r to acquire response signals S2 emitted from the object 103 during the time gaps between the successive RF excitation pulses of a specific frequency, and to accordingly adjust the probehead 102 to acquire spin echo signals S2 associated with several frequencies that are associated with said specific frequency, and with other frequencies different from the specific frequency of the successive excitation RF pulses between which the time gap is defined.

The control system 104 further comprises an analyzer utility 104z configured and operable to receive data indicative of the nuclear spin echo response signals, and to correlate the data with reference data stored in memory 104m, said reference data corresponding to one or more predetermined taggant substances. Based on the determined correlation, the analyzer 104z identifies the one or more taggant substances 103t used to mark the object 103. The control system 104 is further configured and operable to authenticate the examined object 103 according to the identification of one or more taggant substances by the analyzer utility 104z.

Figure 2:
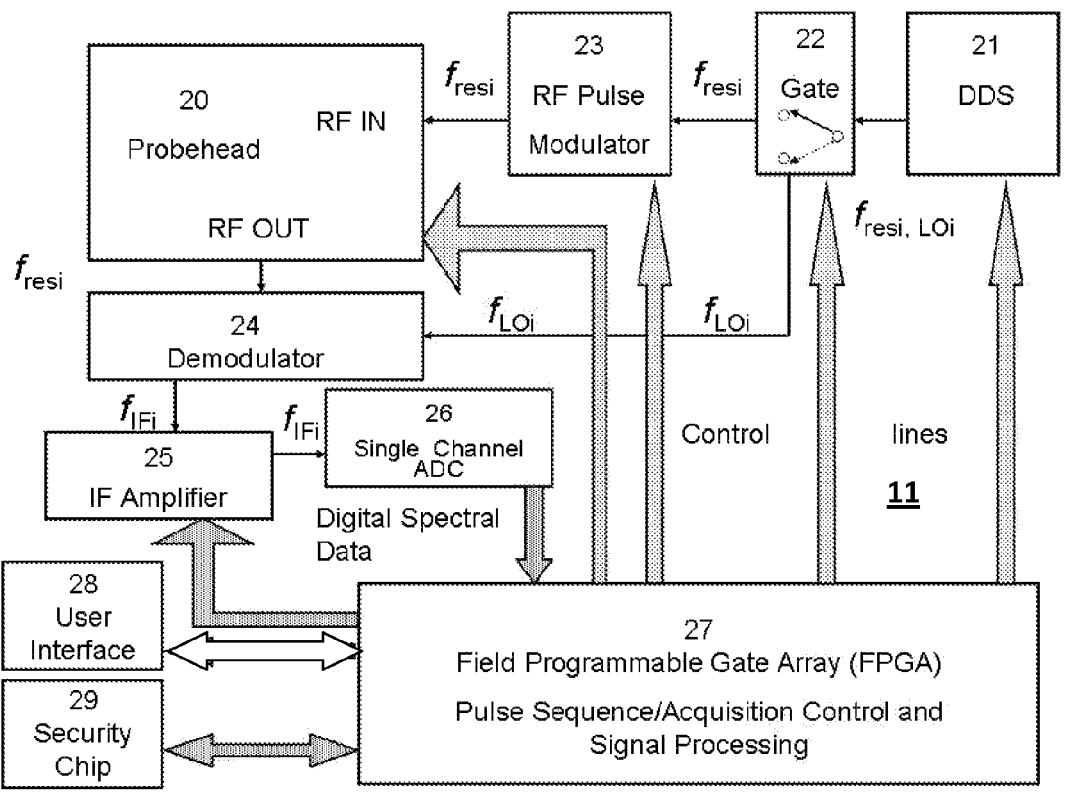
FIG. 2 shows a block diagram of a reader according to some embodiments.

FIG. 2 shows a schematic block diagram exemplifying electronic architecture of the reader 11 according to some possible embodiments. The probehead 20 of the reader 11 is designed to irradiate specifically modulated electromagnetic radiation of one of the resonant frequencies $f_{SEi}$ residing in the MHz waveband $f_{SE1} \div f_{SEn}$ (e.g., in the range of 10 to 1000 MHz) (i and n are positive integers, 1≤i≤n), and then receive magnetic resonance spin echo (SE) response from the taggant at the same frequency. The reader comprises a signal generator 21 (direct digital synthesizer—DDS) configured and operable to operate under control of the control unit 27 to generate predefined excitation pulse sequences having time patterns set to define acquisition time slots during which the relaxation signals are received and processed.

The reader further comprises a gate 22 configured to selectively communicate the signals generated by the signal generator 21 through two different outputs thereof according to control signals received from the control unit 27. For example, in some embodiments the signal generator 21 is configured to generate sinusoidal waves of resonant frequencies $f_{SEi}$ (i.e., excitation frequencies) and phase shifts $\phi_{SEi}$, and corresponding local oscillator frequencies $f_{LOi}$ and phases $\phi_{LOij}$ used to demodulate magnetic resonant signals received from the examined object (where i and j are positive indexing integers). In the excitation cycles the gate 22 communicates the excitation sinusoidal waves $f_{SEi}/\phi_{SEi}$ generated by the signal generator 21 to the modulator 23 (e.g., RF pulse modulator) of the reader 11, which modulates and shapes low power bursts of one of the excitation frequencies $f_{SEi}$. The low power (RF) pulses from the modulator 23 are received by the probehead 20 for further amplification and irradiation of the taggant. In the SE acquisition cycles the gate 22 communicates the sinusoidal local oscillator frequencies generated by the signal source 21 (e.g., at local oscillator frequencies $f_{LOi}$ and phases $\phi_{LOij}$) to the demodulator 24.

In the acquisition cycles the magnetic resonance SE responses at the resonant frequencies $f_{SEi}$ are received and are preliminarily amplified by the probehead 20. The amplified received signals from the probehead 20 are then demodulated by the demodulator (mixer) 24 to the off-resonant SE signal at the corresponding intermediate frequencies (IF)=$f_{IFi}$=$f_{SEi}$-$f_{LOi}$. These off-resonant SE signals at $f_{IFi}$ are amplified by the IF amplifier 25, and thereafter digitized by the analog-to-digital convertor (DAC) 26 (e.g., high-speed high resolution DAC). The digitized SE signals (spectral data) are then received by the control unit 27 for storage, signal processing, analysis and decision making.

In some embodiments the control unit 27 is implemented as a single field programmable gate array (FPGA) chip comprising a main processor block (not shown), pulse sequence and acquisition control block (not shown), IF amplifier auto gain control loop (AGC, not shown), SE signals memory bank (not shown), patterns memory bank (not shown), signal processing block (not shown) and interface block (not shown).

In some embodiments the main processor is configured and operable to control the operation of the pulse sequence and acquisition control block. The main processor block further controls operational parameters of the signal source 21 (e.g., frequencies and phase shifts), and of the modulator 22 (e.g., pulse length, pulse power, pulse shape, delay between pulses and pulses' packages). The main processor block may also control operation of the gate 22 (e.g., switching between excitation and acquisition cycles), of the IF amplifier 25 (e.g., gain control), and of all gates and tuning units in the probehead 20.

The main processor block may further control storage of the digitized SE signal in the SE signals memory bank, processing of the digitized signals, decision making and data communication between the control unit 27 and the user interface unit 28. The user interface unit 28 may be configured and operable to report (e.g., by flashing LEDs, text/icons in alpha-numerical or graphical display 17 and/or audible signals) on results of the authentication process, and to allow or prohibit transfer of the authentication results to external devices (e.g., computers, personal digital assistant (PDA) devices or smartphones) using standard wired/wireless data communication techniques (e.g., universal serial bus—USB, and/or Bluetooth or near field communication (NFC) wireless modules).

A security chip 29 may be used in the reader 11 to protect its hardware and software against unauthorized hardware and/or software copying and tampering. The security chip 29 may be also used to protect critical volatile data stored in the memory banks and processing blocks, and to provide a digital signature for the device's report validation.

Figure 3:
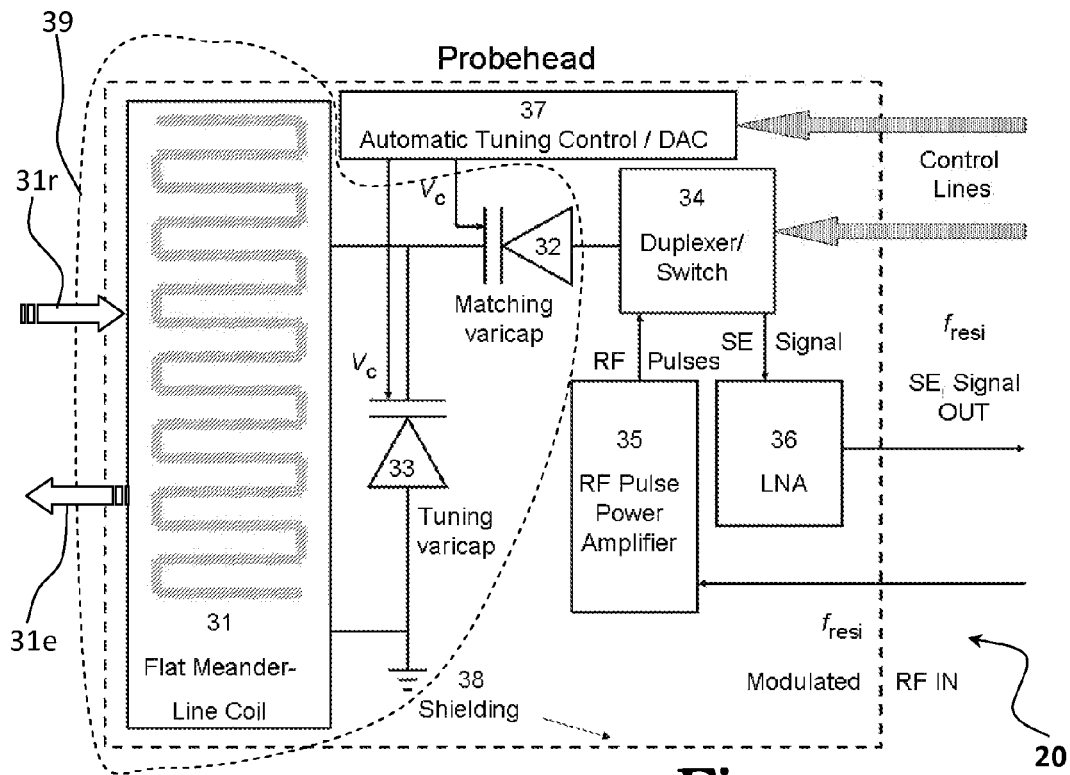
FIG. 3 shows a block diagram of an exemplary probehead usable in a reader according to some possible embodiments.

FIG. 3 is a block diagram showing schematic electronic architecture of the probehead 20 according to possible embodiments. As shown in FIG. 3, the probehead 20 comprises a tunable series-parallel circuitry 39 comprising a near-field antenna 31 (e.g., flat meander-line coil) and voltage-controlled matching and tuning capacitors (e.g., varicaps), 32 and 33. The probehead 20 further comprises the duplexer/switch 34, output signal amplifier 35 (e.g., broadband RF pulse power amplifier), input signal amplifier 36 (broadband Low Noise amplifier—LNA), and the automatic tuning control unit 37 (e.g., implemented using a digital-to-analog convertor), and the magnetic shield 38.

The excitation cycles for each excitation frequency $f_{SEi}$ are typically commenced with a tuning/matching procedure. In the tuning/matching procedure the automatic tuning control (DAC) unit 37 is operated under the control of the control unit 27 to apply varying voltage levels over the tuning capacitors 32 and 33, until a proper response signal is obtained via the antenna 31. The tuning/matching procedure is carried out before performing excitation at a specific frequency, which usually takes several microseconds per each specific frequency. After completing the tuning/matching procedure, the duplexer/switch 34 is set by the control unit 27 to communicate the output signals from the output signal amplifier 35 to the series-parallel circuitry 39, thereby providing excitation of the taggant located in close vicinity to the antenna 31.

In the SE acquisition cycles, the control unit 27 sets the duplexer/switch 34 to communicate the signals received by the series-parallel circuit 39 via the antenna 31, to the input signal amplifier 36 for amplification of the received SE signals.

Figure 4:
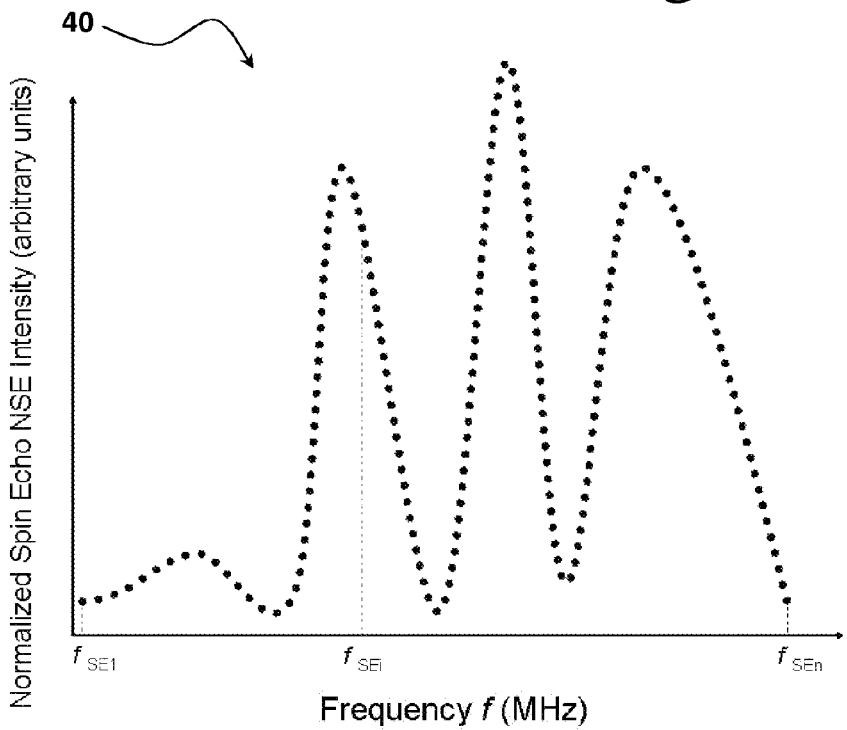
FIG. 4 shows a graphical plot of a normalized spin echo frequency domain profile NSE(f) of a fingerprint taggant according to possible embodiments.

FIG. 4 demonstrates a normalized frequency domain profile NSE(f) of a fingerprint taggant, and principles of registration of such profiles, according to some possible embodiments. During the excitation/acquisition cycles the reader 11 scans the resonant frequency $f_{SEi}$ (i=1, 2, 3 . . . , n-1, n, where n is the number of chosen frequencies) lying within the predefined frequency band from $f_{SE1}$ to $f_{SEn}$. The frequency change may be done in a progressively ascending or descending order, from $f_{SE1}$ to $f_{SEn}$, or vice versa, with a predefined frequency step $\Delta f_{SE} = f_{SEi+1} - f_{SEi}$ (e.g., of about 50 kHz to 5 MHz), or in any other suitable manner by choosing the actual $f_{SEi}$ value from a predefined frequency table (e.g., lookup table, where the index i=1, 2, 3 . . . , n-1, n indicates the number of the excitation frequency in the table).

At each scanning frequency i the time dependent spin echo signal $SE_i(t)$ is excited by applying a sequence of specific RF excitation pulses characterized by a set of predefined parameters. For example, such a set of predefined parameters may comprise parameters associated with the excitation signals, such as the resonant frequency $f_{SEi}$, phase shifts $\phi_{SEji}$, signal power $P_{SEi}$ and shape $S_{SEi}$, and parameters associated with the relaxation signals $SE_i(t)$ signal, such as the local oscillator frequency $f_{LOi}$ and the phase shifts $\phi_{LOji}$ (where i=1, 2, 3 . . . , n-1, n and j=1, 2) used for demodulating the received magnetic resonance signals.

After the obtained single channel $SE_i(t)$ signals (1≤i≤n) are digitized by the ADC 26 they are passed through pattern recognition and digital quadrature detection modules of the control unit 27. The control unit 27 then builds a power spectrum envelope from the processed $SE_i(t)$ signals. Typically, the ADC 26 provides the control unit 27 with a plurality of samples for each obtained signal $SE_i(t)$. The sample having the maximal amplitude value of the power spectrum of each $SE_i(t)$ signal is normalized to the respective frequency $f_{SEi}$ value to be stored in the memory as $NSE_i$ (i.e., single point in a normalized frequency domain profile NSE(f) shown in FIG. 4). After normalizing the maximal amplitude values of each $SE_i(t)$ signal (1≤i≤n), an entire set of n $NSE_i$ points (i=1, 2, 3 . . . , n-1, n) is obtained. This set of n $NSE_i$ points (1≤i≤n) is considered as a signature.

Figure 5:
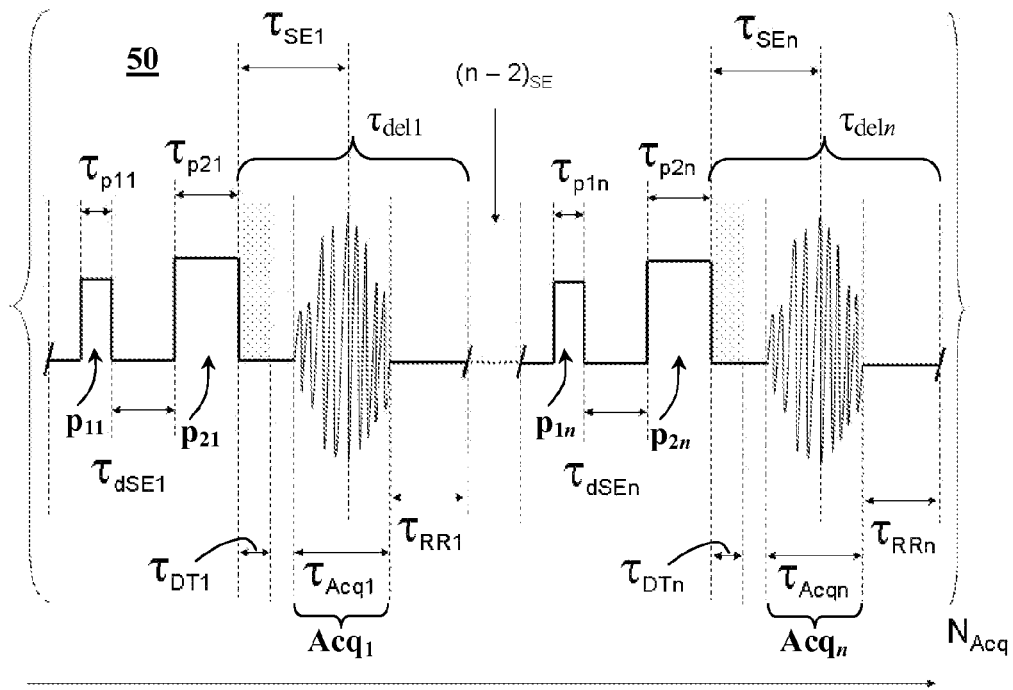
FIG. 5 shows a time domain profile of an excitation/acquisition scanning comb spin echo (SCSE) sequence according to possible embodiments.

FIG. 5 demonstrates a time domain profile of excitation/acquisition sequence 50 usable for fast and reliable registration of wide line magnetic resonance signals according to some possible embodiments. The excitation/acquisition sequence 50 exemplified in FIG. 5 is also referred to herein as a scanning comb spin echo (SCSE) sequence. A characterizing feature of the SCSE sequence 50 is the use of short time delays $\tau_{deli}$ (e.g., of about 20-50 microseconds) between the pairs of SE excitation pulses (also referred to herein as two-pulse excitation) of different excitation frequencies, i.e., between pairs $(p_{1i}, p_{2i})$ and $(p_{1(i+1)}, p_{2(i+1)})$ (1≤i<n). On working with a single frequency these delays are usually of relatively long time durations (e.g., at least ~1.3 $T_{1i}$, where $T_{1i}$ is "longitudinal" spin-lattice relaxation time for the nuclei of a specific material, also referred to herein as i-type nuclei).

The use of such relatively short time delays $\tau_{deli}$ between adjacent excitation cycles is compensated by the following excitation of other frequencies in such a manner that a total delay between excitations of nuclei at the same frequency $f_{SEi}$ will satisfy the ~1.3 $T_{1i}$ relaxation time conditions. It guarantees relaxation of the nuclear magnetization to its initial state, and thus permits excitation and acquisition of $SE_{k≠i}$ signals from the nuclei of other types (k-types), which have not been excited by the previous pairs of excitation pulses $(p_{1i}, p_{2i}, i≠k)$. In this way, the excitation/acquisition sequence provides sufficient time for registration of widespread spectral profiles without losing $SE_i$ intensities, which may occur due to the saturation of magnetic resonance signals occurring at excitation with short time delays ($\tau_{deli}$<1.3 $T_{1i}$) between consecutive pairs of RF excitation pulses $(p_{1i}, p_{2i})$.

Each one of the RF excitation pulses $p_{1i}$ and $p_{2i}$ in FIG. 5 is characterized by the following parameters: pulse resonant frequency $f_{SEi}$, pulse length/duration $\tau_{pji}$, pulse phase shift $\phi_{ji}$, pulse power $P_{ji}$ and pulse shape $S_{ji}$ (where i=1, 2, 3 . . . , n-1, n and j=1, 2). Each acquisition cycle $Acq_i$ in FIG. 5 is characterized by local oscillator frequency $f_{LOi}$, length/time duration $\tau_{Acqi}$ and acquisition phase $\phi_{Acqi}$ (where i=1, 2, 3 . . . , n-1, n). The excitation/acquisition sequence 50 starts with the excitation cycle at frequency $f_{SE1}$ (i=1). First RF excitation pulse $p_{11}$ having a time duration $\tau_{p11}$ and the phase $\phi_{11}$ is applied, and after a relatively short time delay $\tau_{dSE1}$<$T_{21}$ (where $T_{21}$ is "transversal" spin-spin relaxation time for the i-type nuclei—characteristic decoherence time for $SE_1$) the second RF excitation pulse $p_{21}$ is applied. The second RF excitation pulse $p_{21}$ has a time duration $\tau_{p21}$ and a phase shift $\phi_{21}$.

Following the application of the first excitation RF pulses $(p_{11}, p_{21})$, the first acquisition cycle $Acq_1$ starts after a time delay of $(\tau_{SE1} - \tau_{Acq1}/2) > \tau_{TD1}$ from the second excitation RF pulse $p_{21}$, where $\tau_{SE1} = \tau_{dSE1} + (\tau_{p11} + \tau_{p21})/2$, and $\tau_{TD1}$ is characteristic dead time of the receiver (i.e., of the input signal amplifier 36 and of the demodulator 24). The first acquisition cycle is conducted over duration of time $\tau_{Acq1}$ at local oscillator frequency $f_{LO1}$, and with acquisition phase $\phi_{Acq1}$. The $SE_1(t)$ sampled values obtained in this acquisition cycle are stored in a first memory segment (also referred to herein as $M_1$) of the signals memory bank. The time delay $\tau_{RR1}$ after the first acquisition cycle allows fine adjustment of the total length of the event at the frequency $f_{SE1}$ to satisfy the condition $$\sum_{i=2}^{n}(\tau_{p1i} + \tau_{dSEi} + \tau_{p2i} + \tau_{SEi} + \tau_{Acqi}/2 + \tau_{RRi}) \geq 1.3T_{11}.$$

After completing the first acquisition cycle and the lapse of the $\tau_{RR1}$ time delay, the second pair of excitation pulses (i=2) having frequency $f_{SE2}$ is applied. This excitation/acquisition process continues as the indexing parameter i is increased until reaching i=n, where a single $SE^{(1)}_i$ (1≤i≤n) excitation/acquisition sequence is completed. Then the entire aforementioned excitation/acquisition sequence repeats $N_{Acq}$ times to obtain further scans $SE^{(q)}_i$ (1≤i≤n, 1<q≤$N_{Acq}$) signals in the scanned frequency range, in order to improve signal-to-noise ratio by means of the coherent acquisition technique. At each of the $SE^{(q)}_i$ (1≤q≤$N_{Acq}$) scans the phase shifts $\phi_{1i}$, $\phi_{2i}$ and $\phi_{Acqi}$ are determined using a corresponding phase table according to a preset phase cycling scheme (e.g., 2-phase cycling scheme, 16-phase cycling scheme, or 256-phase cycling). In some embodiments different phase cycling schemes may be used in the different frequency scans, depending on the shape and parameters of the SE signal from the interrogated taggant. For example, in taggants having relatively long spin-spin relaxation times $T_2$, the simplest 2-phase cycling scheme may suffice, and in cases where the interrogated taggant nuclei have significantly short spin-spin relaxation times $T_2$ more complicated phase cycling schemes (e.g., 16-phase or 256-phase cycling) should be used.

The use of phase cycling techniques allows quenching spurious interfering signals appearing due to ringing (i.e., ringing artifacts) of the resonant circuit, of the coherent electromagnetic interferences, and of the Free Induction Decay (FID) signals as well, that may follow the second excitation pulse ($p_{2i}$). Such quenching permits working with short $\tau_{dSE1}$ delays between the excitation pulses $p_{1i}$ and $p_{2i}$, and increases reliability of the obtained $SE_i$ (1≤i≤n) magnetic resonant signals.

Figure 6:
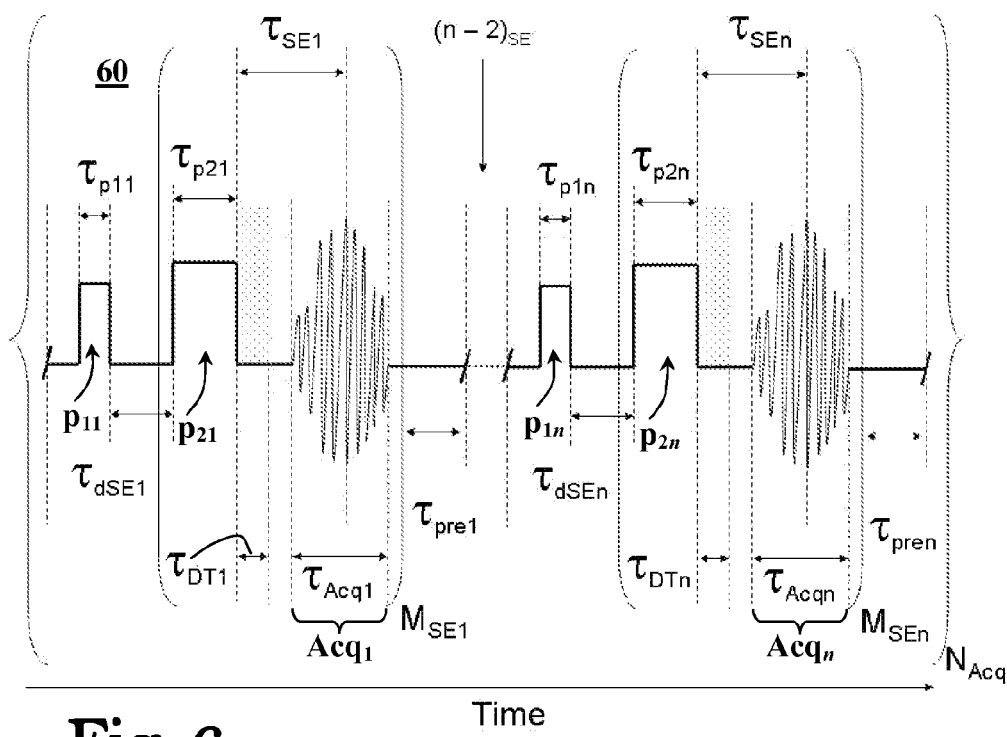
FIG. 6 shows a time domain profile of an excitation/acquisition scanning steady state spin echo (4SE) sequence according to possible embodiments.
Figure 9:
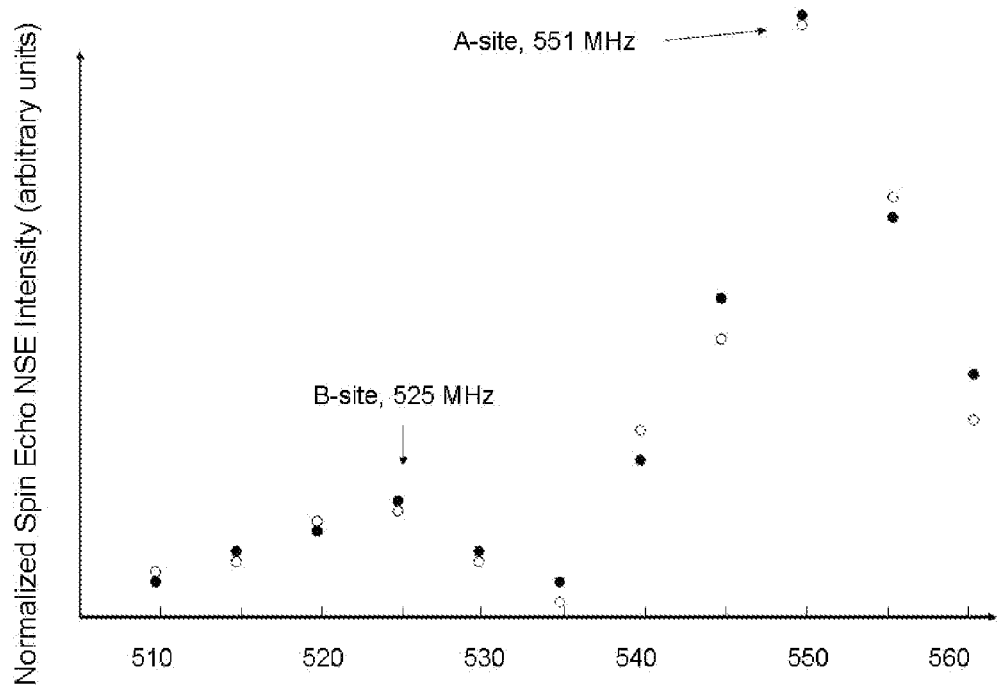
FIG. 9 is a graphical plot of normalized spin echo frequency domain profiles NSE(f) of a fingerprint taggant Mnf(W) obtained at room temperature, wherein solid circles ("●") are used to present the basic profile $NSE(f)^{Ideal}$ obtained from ~2 mg (milligram) of the taggant, and unfilled circles ("○") are used to present the test profile $NSE(f)^{Test}$ obtained from 125 µg (micrograms) of the taggant dispersed within the 3 µm offset printing ink layer.
Figure 10:
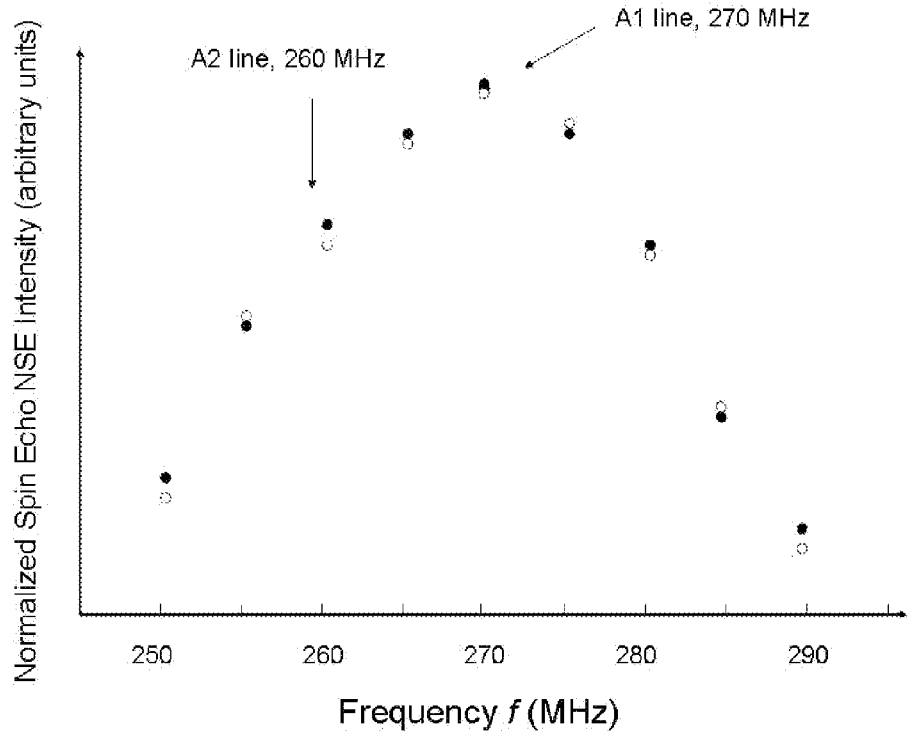
FIG. 10 is a graphical plot of normalized spin echo frequency domain profiles NSE(f) of a fingerprint taggant LSMO obtained at room temperature, wherein solid circles ("●") are used to present the basic profile $NSE(f)^{Ideal}$ obtained from ~6 of the taggant, and unfilled circles("○") are used to present the test profile $NSE(f)^{Test}$ obtained from 210 µg of the taggant dispersed within the 3 µm offset printing ink layer.

FIG. 6 shows a time domain profile 60 of another excitation/acquisition sequence for fast and reliable registration of wide line magnetic resonance signals according to possible embodiments. The time domain profile 60 shown in FIG. 6 is also referred to herein as a scanning steady state spin echo (4SE) sequence. A characterizing feature of the 4SE sequence is cyclically repeating $M_{SEi}$ times the second excitation pulse $p_{2i}$ at each of the $f_{SEi}$ frequencies (1≤i≤n), and the subsequent coherent acquisitions of $M_{SEi}$ number of $SE_i$ signals. This procedure is based on the phenomenon of steady state spin echoes that provides a series of undamped SE signals of reduced intensities at time delays exceeding both $T_{2i}$ and $T_{1i}$ relaxation times. The use of the 4SE sequence 60 allows reduction (compared to the SCSE sequence) of total acquisition time while substantially keeping the same signal-to-noise ratio.

Each one of the excitation pulses $p_{1i}$ and $p_{2i}$ in the 4SE sequence 60 shown in FIG. 6 is characterized by the following parameters: pulse resonant frequency $f_{SEi}$, pulse length/duration time $\tau_{pji}$, pulse phase shift $\phi_{ji}$, pulse power $P_{ji}$ and pulse shape $S_{ji}$, where i=1, 2, 3 . . . , n-1, n and j=1, 2. Each acquisition cycle in the 4SE sequence 60 is characterized by local oscillator frequency $f_{LOi}$, length/duration $\tau_{Acqi}$ and acquisition phase $\phi_{Acqi}$ where i=1, 2, 3 . . . , n-1, n. The sequence 60 starts by applying the excitation pulses at frequency $f_{SE1}$ (i=1). First excitation pulse $p_{11}$, having a time duration $\tau_{p11}$ and phase $\phi_{11}$, is applied, which is then followed by the second excitation pulse $p_{21}$, having a time duration $\tau_{p21}$ and phase $\phi_{21}$. The excitation pulses $p_{1i}$ and $p_{2i}$ are separated by the time delay $\tau_{dSE1} < T_{21}$, where $T_{21}$ is the "transversal" spin-spin relaxation time for the nuclei of the first material type i.e., the 1-type nuclei having characteristic decoherence time of $SE_1$.

The first acquisition cycle starts after the time delay of $(\tau_{SE1} - \tau_{Acq1}/2) > \tau_{TD1}$ has lapsed after the second excitation pulse $p_{21}$, where $\tau_{SE1} = \tau_{dSE1} + (\tau_{p11} + \tau_{p21})/2$, $\tau_{TD1}$ is a characteristic dead time of the receiver (input signals amplifier 36 and demodulator 24). The $\tau_{pre1}$ delay time is a pre-delay before the next excitation/acquisition cycle. The $\tau_{pre1}$ delay time is usable for possible corrections of total delays between excitations at different frequencies in cases when the total time is still short to satisfy the ~1.3 $T_1$ time condition. For instance, if only two or three resonance frequencies are being measured, in this case the total time may be quite short and it may be extended using the $\tau_{pre1}$ delay times.

The first acquisition cycle $Acq_1$ lasts over $\tau_{Acq1}$ time duration at local oscillator frequency $f_{LO1}$ with acquisition phase $\phi_{Acq1}$. The $SE_1(t)$ sampled values obtained in this acquisition cycle are stored in the $M_1$ memory segment of the signals memory bank. Then both the second excitation pulse $p_{21}$, having the same frequency $f_{SE1}$, and the acquisition cycle at $f_{LO1}$, are cyclically repeated $M_{SE1}$ times and the $SE_1(t)$ sampled values obtained after each one of these acquisition cycles are coherently averaged in the same $M_1$ memory segment of the signals memory bank. Thereafter this excitation/acquisition process is carried out using the second excitation frequency $f_{SE2}$ (i=2) for which the $SE_2(t)$ sampled values obtained are coherently averaged in the $M_2$ memory segment, and so forth until reaching i=n wherein a single $SE_i$ (1≤i≤n) acquisition is completed.

The entire aforementioned excitation/acquisition sequence, including repeated $M_{SEi}$ excitation/acquisition steady state cycles for each excitation frequency $f_{SEi}$ (1≤i≤n), is repeated $N_{Acq}$ times following a predetermined phase cycling scheme to further improve the signal-to-noise ratio. At each of the $SE^{(q)}_i$ (1≤q≤$N_{Acq}$) scans the phase shifts $\phi_{1i}$, $\phi_{2i}$ and $\phi_{Acqi}$ are determined by a corresponding preset phase table according to the phase cycling scheme that is being used (e.g., 2-phase cycling scheme, 16-phase cycling scheme, 256-phase cycling).

Accordingly, in the 4SE pulse sequence 60 for each resonance frequency $f_{SEi}$ the response signal is accumulated by coherent acquisition of multiple spin echo signals excited at the same frequency by the $M_{SEi}$ cyclically repeated excitation pulse $p_{2i}$. The inventors of the present invention found that by careful selection of the scan parameters (e.g., time delays, phase shifts etc.), the multiple spin-echo signals obtained using the 4SE sequence 60 do not decay following short spin-spin relaxation time $T_2$. This phenomenon is advantageously exploited in some embodiments of the present invention to acquire multiple spin echo signals associated with the specific excitation frequency and with other excitation frequencies, within the same time slot as in the SCSE sequence 50.

FIG. 7 is a flow chart demonstrating processing of a single $SE_i(t)$ (i=1, 2, . . . , n) signal according to some possible embodiments. In this example, the sampled time dependent signal $SE_i(t)$, acquired for excitation pulses having a frequency $f_{SEi}$, is a vector of p elements $A_i^k$ (k=1, 2, . . . , p), where p>31 is number of digital acquisition points. In some embodiments the elements $A_i^1 \div A_i^{p-11}$ represent a single channel $SE_i$ time window and elements $A_i^{p-10} \div A_i^p$ represent a noise window.

The signal acquisition step 71 includes in some embodiments signal accumulation by multiple ($N_{Acq}$ times) summation of single shot $A_i^k$ vectors i.e., summations of sample vectors $A_i^k$ obtained for the same excitation frequency $f_{SEi}$. The resulting accumulated $A_i^k$ vector is characterized by improved signal-to-noise ratio. In particular, the signal to noise ratio increases relative to the square root of the number of acquisition scans, $\sqrt{N_{Acq}}$.

For example, in the SCSE sequence (50 in FIG. 5) in each $M_i$ memory segment (i.e., associated with a specific frequency $f_{SEi}$ from the scanned range) of the signals memory bank the echo responses associated with the specific frequency $f_{SEi}$ are accumulated $N_{aqc}$ times after each pair of excitation pulses ($p_{1i}$ $p_{2i}$). Accordingly, in the SCSE sequence for each specific frequency $f_{SEi}$ a set of $N_{aqc}$ spin echo signals $SE^{(q)}_i$ ($1 \leq i \leq n$, $1 < q \leq N_{Acq}$) are coherently acquired (summed), which is used to improve the signal to noise ratio by a factor of $\sqrt{N_{Acq}}$.

In the 4SE sequence (60 in FIG. 6), in each $M_i$ ($1 \leq i \leq n$) memory segment the process accumulates $M_{SEi}$ steady state echo responses received in each frequency scan in response to the cycling excitation of the second pulse $p_{2i}$. The frequency scan sequence (including all internal cycles for accumulation of the steady state echoes) is repeated $N_{Acq}$ times, such that a total of $M_{SEi} \times N_{Acq}$ spin echo signals $SE^{(q)}_i$ ($1 \leq i \leq n$, $1 < q \leq M_{SEi} \times N_{Acq}$) are coherently acquired and then stored in the $M_i$ memory segment for each $f_{SEi}$. By acquiring $M_{SEi}$ decaying steady state echo signals the signal to noise ratio is improved by a factor of $\sim 0.7 \times \sqrt{M_{SEi}}$ for each frequency ($f_{SEi}$), and since the frequency scan sequence is repeated $N_{Acq}$ times, the signal to noise ratio is improved for the 4SE sequence 60 in total by a factor of $\sim 0.7 \times \sqrt{M_{SEi} \times N_{Acq}}$ for each specific frequency ($f_{SEi}$).

In the following step 72 convolution of the $A_i^k$ vector is performed with two predefined orthogonal basic vectors representing the ideal $SE_i(t)$ signal obtained in ideal measurement conditions e.g., by long time acquisition made on large amount of samples of the taggant, or simulated theoretically and stored in the pattern memory block of the control unit (27). The aim of the convolution step 72 (also referred to herein as digital quadrature signal processing) is to provide both digital filtering and digital quadrature detection of the accumulated $SE_i(t)$ signal. All aforementioned procedures allow extracting weak $SE_i(t)$ signals whose levels are well below the level of overall (internal and external) electromagnetic interference signals (signal-to-noise ratio below 1).

After performing the convolution in step 72 two orthogonal vectors are obtained: an in-phase vector $CI_i^k$ and a quadrature vector $CQ_i^k$. These vectors are used for the calculation of the signal's magnitude vector $MAG_i^k = \sqrt{(CI_i^k)^2 + (CQ_i^k)^2}$ ($1 \leq i \leq n$ and $1 \leq k \leq p$), and signal-to-noise ratios: $SNR_i^{Signal}$ for a single window, and $SNR_i^{Noise}$ for a noise window. Here $SNR_i^{Signal}$ is defined as $SNR_i^{Signal} = \mu^{Signal}/\sigma^{Signal}$, where $\mu^{Signal}$ is the mean value of the signal found in the signal window as a result of convolution with the basic vectors, and $\sigma^{signal}$ is the standard deviation of the signal in the same window. $SNR_i^{Noise} = \mu^{Noise}/\sigma^{Noise}$ is defined in the same manner, where $\mu^{Noise}$ is the mean value of signal-like component found in the noise window as a result of convolution with the basic vectors, and $\sigma^{Noise}$ is the standard deviation of the noise in the same window. The results of all calculations are stored in the corresponding memory segment $M_i$ of the memory bank.

FIG. 8 is a flowchart exemplifying multiple spin echo signal analysis and recognition of zero external field magnetic resonance signature according to some possible embodiments. This process begins in step 81 wherein the $MAG_i^k$, matrix composed of i-number of k-length vectors stored in the $M_1 \div M_n$ memory segments of the memory banks, is analyzed for extrema, following which $MAG_i^{max}$ values (i=1, 2, . . . , n) are found and then normalized to corresponding frequencies. The resulting normalized $N(MAG_i^{max})$ vector represents the frequency domain profile $NSE(f)^{Test}$ for the sample under test (e.g., the label 13), and it provides a power spectrum of the acquired $SE_i$ signals as demonstrated in FIG. 4.

In the next step 82 the $MAG_i^{max}$ vector is correlated with a predefined vector $MAG_i^{Ideal}$ representing the ideal frequency domain signal $NSE(f)^{Ideal}$ obtained in ideal measurement conditions e.g., by long time acquisition cycles carried out on large amounts of the taggant, or simulated theoretically and stored in the pattern memory block of the control unit 27. Then, in step 83, the correlation coefficient $C_{corr}$ and profile integral $$I_{NSE} = \sum_{i=1}^{n} MAG_i^{max} \times \Delta f_{SEi},$$

which is proportional to the integral amount of the taggant within the probehead area, are calculated.

Next, in step 84, all parameters obtained ($C_{corr}$, $I_{NSE}$, $SNR_i^{Signal}$ and $SNR_i^{Noise}$) are compared with a corresponding set of predefined threshold values ($C_{corr-thresh}$, $I_{NSE-thresh}$, $SNR_i^{Signal-thresh}$ and $SNR_i^{Noise-thresh}$). In some embodiments, if it is found in step 84 that one of the parameters obtained in the test is below its corresponding predefined threshold value, then it is determined that the authentication test has failed and a corresponding indication is issued via the user's graphical and audio interface (28) as control is passed on to step 85. In the event that all parameters obtained in the test are above their corresponding predefined threshold values, then it is determined that the authentication test has succeeded, and a corresponding indication is issued via the user's graphical and audio interface (28) as control is passed on to step 86.

EXAMPLES

Example 1

Several grams of ferrimagnetic manganese ferrite $MnFe_2O_4$ of the Mnf(W) type with $T_c$=770 K were synthesized by precipitation from ferrous and manganous aqueous solutions (H. Yasuoka, A. Hirai, T Shinjo, M. Kiyama, Y. Bando, T Takada, *J. Phys. Soc. Jap.*, 22 (1967) 174-180) and then pulverized to micron sized (having mean size of about 2 μm) powder. Then a relatively large amount (~2 mg) of the micron sized Mnf(W) powder was placed near the probehead of the reader and the SCSE sequence was applied. The test was carried out at room temperature. The following parameters of the SCSE sequence were used: $f_{SE1}$=510 MHz, $\Delta f_{SE}$=5 MHz, $f_{IFi}$=−1.75 MHz, n=11, $\phi_{SE1i}$=(0°, 0°), $\phi_{SE2i}$=(0°, 180°), $\phi_{Acqi}$=(0°, 180°), $P_{SEi1}$=$P_{SEi2}$=2 W, $S_{SEi1}$=$S_{SEi2}$=Gaussian, $\tau_{p1i}$=0.8 μs, $\tau_{p2i}$=1 μs, $\tau_{dSEi}$=6 μs, $\tau_{Acqi}$=0.5 μs, $\tau_{RRi}$=21 μs and $N_{Acq}$=32000. Total test time was 10.6 seconds. Signal-to-noise ratio achieved was above 10 for the lowest peak (at 525 MHz) SE intensity. Broad line frequency domain profile $NSE(f)^{Ideal}$ obtained as a result of this test is plotted in FIG. 9 by solid circles.

Thereafter, the obtained frequency domain profile was stored in the pattern memory block of the control unit as a baseline reference profile (i.e., signature) for further pattern recognition. This Mnf(W) powder was then used as a model fingerprint taggant for the simulation of authentication using offset printing by tagged ink.

Micron sized Mnf(W) powder was mixed with commercial offset printing ink in proportion of 12.5% by dry weight of Mnf(W) powder to 87.5% by dry weight of offset printing ink. This ink with additives was used for the imitation of the offset printing using commercial IGT Orange Proofer machine. The average printed layer thickness was about 3 μm. The total amount of the taggant within the probehead sensing area was about 125 μg. The SCSE sequence used had the same parameters as above except for the number of excitation/acquisition scans, which was $N_{Acq}=10000$ (test time 3.3 seconds). Signal-to-noise ratio achieved was above 3 for the lowest peak (at 525 MHz) SE intensity. Result of this test $NSE(f)^{Test}$ is plotted in FIG. 9 by unfilled circles. Correlation coefficient between the test profile $NSE(f)^{Test}$ and the reference profile $NSE(f)^{Ideal}$ was found to be $C_{corr}=+0.8$. According to the predefined parameters set the authentication was recognized as successful.

Example 2

Several grams of ferromagnetic manganite $La_{0.7}Sr_{0.3}MnO_3$ (LSMO) ceramics with $T_c=364$ K were synthesized from reagent grade oxides by conventional sintering technique (Y-Ch. Liou, Y-R. Chen, *Ceram. Intern.*, 34 (2008) 273-278) and then pulverized into micron sized (having mean size of about 2 μm) powder. Then relatively large amount (~6 mg) of the micron sized LSMO powder was placed near the probehead of the reader and the SCSE sequence was applied. The test was carried out at room temperature. The following parameters of the 4SE sequence were used: $f_{SE1}=250$ MHz, $\Delta f_{SE}=5$ MHz, $f_{IFi}=1.5$ MHz, n=9, $\phi_{SE1i}=(0°, 0°)$, $\phi_{SE2i}=(0°, 180°)$, $\phi_{Acqi}=(0°, 180°)$, $P_{SEi1}=P_{SEi2}=1.2$ W, $S_{SEi1}=S_{SEi2}=$Rectangular, $\tau_{p1i}=\tau_{p2i}=0.5$ μs, $\tau_{dSEi}=4$ μs, $\tau_{Acqi}=0.5$ μs, $\tau_{prei}=0.2$ μs, $M_{SE}=128$ and $N_{Acq}=1000$. Total test time was 7 seconds. Signal-to-noise ratio achieved was above 8 for the peak at 270 MHz. Broad line frequency domain profile $NSE(f)^{Ideal}$ obtained as a result of this test is plotted in FIG. 10 by solid dots. Thereafter the frequency domain profile obtained was stored in the pattern memory block of the control unit as a baseline profile reference (i.e., signature) for further pattern recognition. This LSMO powder was then used as a model fingerprint taggant for the simulation of authentication using offset printing by tagged ink.

Micron sized LSMO powder was mixed with commercial offset printing ink in proportion of 12.5% by dry weight of LSMO powder to 87.5% by dry weight of offset printing ink. This ink with additives was used for the imitation of the offset printing using commercial IGT Orange Proofer machine. The average printed layer thickness was 5 μm. The total amount of the taggant within the probehead sensing area was about 210 μg. The 4SE sequence used had the same parameters as above except for the number of excitation frequencies scans used, which was $N_{Acq}=250$ (test time 1.8 seconds) was applied. Signal-to-noise ratio achieved was above 3 for the peak at 270 MHz. A result of this test $NSE(f)^{Test}$ is plotted in FIG. 10 by unfilled circles. Correlation coefficient between the test profile $NSE(f)^{Test}$ and the basic profile $NSE(f)^{Ideal}$ was found to be $C_{corr}=+0.9$. According to the predefined parameters set the authentication was recognized as having been successful.

The above examples and description have of course been provided only for the purpose of illustration, and are not intended to limit the invention in any way. As will be appreciated by the skilled person, the invention can be carried out in a great variety of ways, employing more than one technique from those described above, all without exceeding the scope of the invention.

The invention claimed is:

1. An apparatus for fast detection and recognition of one or more predetermined taggant substances marking an object and being of a type having predefined zero external field magnetic resonance signatures, wherein the apparatus is configured as a hand-held device comprising:
    a signal generator mounted to said hand-held device and configured and operable for generating a sequence of specific excitation pulses of electromagnetic radiation of multiple frequencies within a predefined frequency band;
    a probehead mounted to said hand-held device and comprising a transmitter configured and operable to receive the sequence of specific excitation pulses of electromagnetic radiation from said signal generator, and to irradiate the object comprising one or more of the predetermine taggant substances with the pulsed electromagnetic radiation, and a receiver configured and operable for acquiring nuclear spin echo response signals from the irradiated object and generating data indicative thereof;
    a control system mounted to said hand-held device and comprising:
        a transmission controller configured and operable to operate the signal generator to generate said sequence of specific excitation pulses having a predetermined time and frequency scanning pattern;
        an acquisition controller configured and operable to operate the receiver for acquiring the nuclear spin echo response signals with a predetermined time and frequency acquisition pattern,
        wherein the scanning and acquisition patterns are configured such that the pulses of multiple frequencies are successively transmitted and multiple nuclear spin echo response signals for said multiple frequencies are successively acquired within time slots, each time slot being defined between successive excitation pulses of a same specific excitation frequency, the frequencies of said response signals successively acquired within each time slot being thereby associated with said specific frequency of said successive excitation pulses, duration and timing of each time slot being selected in accordance with spin-lattice relaxation time of nuclei resonating at said specific frequency of a respective successive excitation pulse, thereby allowing successive transmission of the excitation pulses of said multiple frequencies, defined by the scanning pattern, without waiting for relaxation of responses of taggant substances to previous excitation pulses in said sequence; and
    an analyzer utility for receiving data indicative of the nuclear spin echo response signals, and correlating said data with reference data corresponding to said one or more predetermined taggant substances, and based on determined correlation, identifying one or more of said predetermined taggant substances.

2. The apparatus according to claim 1 wherein the one or more predetermined taggant substances comprise one or more substances selected from the group consisting of: ferromagnetic substances, ferrimagnetic substances, antiferromagnetic substances, and substances containing nuclei with non-zero nuclear quadrupole moments.

3. The apparatus according to claim 1 wherein the predefined frequency band is in the range of 10 to 1000 MHz.

4. The apparatus according to claim 1 wherein the analyzer utility is configured and operable to digitally decompose the data indicative of the nuclear spin echo response signals into in-phase and quadrature components and generate data indicative of the magnitude of said components for use in the correlating with the reference data.

5. The apparatus according to claim 4 wherein the analyzer is configured and operable to identify the one or more predetermined taggant substances based on one or more of the following parameters: a correlation coefficient calculated based on the correlation with the reference data, a profile integral value calculated based on the data indicative of the magnitude of the in-phase and quadrature components, calculated signal-to-noise-ratio of the received signals, and calculated signal-to-noise-ratio of the noise of the received signals.

6. The apparatus according to claim 1 wherein the signal generator comprises a frequency synthesizer configured and operable to generate continuous time periodic signals in the band of excitation frequencies, and an RF pulse modulator configured and operable to generate the sequence of specific excitation pulses of electromagnetic radiation using the periodic signals generated by the frequency synthesizer.

7. The apparatus according to claim 1 comprising a demodulator unit configured and operable to extract the nuclear spin echo response signals from the acquired response signals.

8. The apparatus according to claim 7 comprising a narrow band amplifier configured to operate at a predefined intermediate frequency determined by the signal generator and the demodulator unit.

9. The apparatus according to claim 1 wherein the probehead comprises a near field antenna and a controllable tuning circuitry configured and operable to adjust reactance of said antenna to frequencies of the signals received or transmitted by the antenna.

10. The apparatus according to claim 9 wherein the near field antenna comprises a flat meander-line coil.

11. The apparatus according to claim 9 wherein the controllable tuning circuitry comprises voltage-controlled matching and tuning capacitors.

12. The apparatus according to claim 9 wherein the controllable tuning circuitry is configured and operable to adjust the probehead to operate at frequencies within the band of 10-1000 MHz.

13. The apparatus according to claim 9, wherein the probehead comprises a controllable switching circuitry configured and operable to selectively communicate signals from the signal generator to the near field antenna, and to communicate the received response signals from the near field antenna to the control system.

14. The apparatus according to claim 13, wherein the probehead comprises one or more amplifiers configured and operable to amplify the signals received from the signal generator and the response signals received by the near field antenna.

15. The apparatus according to claim 1 wherein the receiver is a single channel wide band receiver.

16. The apparatus according to claim 1 comprising a security unit configured and operable to protect the apparatus against unauthorized copying and tampering.

17. The apparatus according to claim 16 wherein the security unit is configured and operable to generate digital signatures for stored or transferred data.

18. The apparatus according to claim 16 wherein the security unit is configured and operable to exchange security keys with the control system.

19. A method for fast detection and recognition of one or more predetermined taggant substances marking an object and being of a type having predefined zero external field magnetic resonance signatures, the method comprising:
irradiating an object comprising one or more of said predetermined taggant substances with a sequence of specific excitation pulses of electromagnetic radiation of multiple frequencies within a predefined frequency band and having a predetermined time and frequency scanning pattern;
receiving nuclear spin echo response signals with a predetermined time and frequency acquisition pattern from the irradiated object, and generating data indicative thereof; and
correlating the data indicative of the nuclear spin echo response signals with reference data corresponding to said one or more predetermined taggant substances, and based on determined correlation, identifying one or more of said predetermined taggant substances;
the scanning and acquisition patterns are configured such that the sequence of the specific excitation pulses of multiple frequencies are transmitted with predetermined time slots between successive excitation pulses of a specific excitation frequency, and the nuclear spin echo response signals for said plurality of frequencies are successively acquired within said time slots, duration and timing of each of said time slots being selected in accordance with spin-lattice relaxation time of nuclei resonating at said specific frequency, thereby allowing successive transmission of the excitation pulses of said multiple frequencies, defined by the scanning pattern, without waiting for relaxation of responses of taggant substances to previous excitation pulses in said sequence.

20. The method according to claim 19 wherein the generating of the sequence of excitation pulses with the scanning pattern uses a steady state-spin echo excitation technique and the irradiating comprises scanning the frequency band a plurality of $N_{Acq}$ times to acquire respective $N_{Acq}$ nuclear spin echo response signals for each excitation frequency and repeatedly applying each excitation pulse associated with a specific excitation frequency within each scan a plurality of $M_{SEi}$ times to acquire a total of $M_{SEi} \times N_{Acq}$ accumulated steady state spin echoes for each excitation frequency.

21. The method according to claim 20 comprising using the accumulated steady state spin echoes of each excitation frequency to improve signal to noise ratio by a factor of $\sim 0.7 \times \sqrt{M_{SEi} \times N_{Acq}}$.

22. The method according to claim 19 comprising digitally determining for the nuclear spin echo response signals in-phase and quadrature components and generating data indicative of the magnitude of said components for use in correlating with the reference data.

* * * * *